United States Patent
Hsu et al.

(10) Patent No.: US 7,341,935 B2
(45) Date of Patent: Mar. 11, 2008

(54) ALTERNATIVE INTERCONNECT STRUCTURE FOR SEMICONDUCTOR DEVICES

(75) Inventors: Ju-Wang Hsu, Taipei (TW); Jyu-Horng Shieh, Hsin-chu (TW); Yi-Chun Huang, Pingjhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 10/877,103

(22) Filed: Jun. 25, 2004

(65) Prior Publication Data

US 2005/0285268 A1   Dec. 29, 2005

(51) Int. Cl.
*H01L 21/4763* (2006.01)

(52) U.S. Cl. .............. 438/618; 438/761; 438/780; 257/E23.132; 257/E23.134; 257/E21.245; 257/E21.246; 257/E21.256

(58) Field of Classification Search .............. 438/758, 438/780, 761, 706, 712, FOR. 388; 257/E23.132, 257/E23.134, E21.245, E21.246, E21.256
See application file for complete search history.

(56) References Cited

U.S. PATENT DOCUMENTS

| | | | |
|---|---|---|---|
| 6,000,947 A * | 12/1999 | Minne et al. .............. 438/759 |
| 6,534,788 B1 * | 3/2003 | Yeo et al. .............. 257/72 |
| 6,583,068 B2 * | 6/2003 | Yan et al. .............. 438/761 |
| 6,831,007 B2 * | 12/2004 | Kim .............. 438/643 |
| 2001/0023121 A1 * | 9/2001 | Meijer et al. .............. 438/586 |
| 2002/0142620 A1 * | 10/2002 | Yan et al. .............. 438/761 |
| 2004/0157444 A1 * | 8/2004 | Chiu et al. .............. 438/689 |
| 2004/0198066 A1 * | 10/2004 | Verhaverbeke .............. 438/745 |
| 2004/0224526 A1 * | 11/2004 | Shoki .............. 438/758 |
| 2004/0248420 A1 * | 12/2004 | Yun et al. .............. 438/706 |
| 2004/0256726 A1 * | 12/2004 | Harada et al. .............. 257/758 |
| 2005/0009342 A1 * | 1/2005 | Chen et al. .............. 438/689 |
| 2005/0255703 A1 * | 11/2005 | Sato .............. 438/738 |
| 2005/0277299 A1 * | 12/2005 | Le et al. .............. 438/694 |

* cited by examiner

*Primary Examiner*—Michelle Estrada
(74) *Attorney, Agent, or Firm*—Duane Morris LLP

(57) ABSTRACT

A semiconductor interconnect structure includes an organic and/or photosensitive etch buffer layer disposed over a contact surface. The structure further provides an interlevel dielectric formed over the etch buffer layer. A method for forming an interconnect structure includes etching to form an opening in the interlevel dielectric, the etching operation being terminated at or above the etch buffer layer. The etch buffer layer is removed to expose the contact surface using a removal process that may include wet etching, ashing or DUV exposure followed by developing or other techniques that do not result in damage to contact surface. The contact surface may be a conductive material such as silicide, salicide or a metal alloy.

25 Claims, 5 Drawing Sheets

ALTERNATIVE INTERCONNECT STRUCTURE FOR SEMICONDUCTOR DEVICES

FIELD OF THE INVENTION

The present invention relates, most generally, to semiconductor devices and methods for forming the same. More particularly, the present invention relates to an interconnect structure formed using an organic and/or photosensitive etch buffer layer.

BACKGROUND OF THE INVENTION

Interconnect structures of semiconductor devices play a critical role in connecting the various active and functional features of the semiconductor device to one another. Interconnect structures include various openings formed through insulating materials and which expose at least one contact surface. Commonly, a conductive interconnect material is introduced into the opening to contact the exposed contact surface of another conductive interconnect material or an active device feature that is exposed within the opening. It is important to maintain the integrity of the interconnect openings and the surfaces of the respective conductive or active device parts that contact each other through the interconnect openings.

A typical interconnect opening includes a generally vertical opening formed through an insulating layer or layers to expose a subjacent contact surface which may be a conductive wire or active device part. RF or reactive ion etching processes are typically used to form the openings. The etching process used to form the opening through the insulating materials may begin to attack the exposed contact surface as the insulating materials are being removed. To address this problem, an etch-stop layer interposed between the insulating layer and the contact layer has been used. With the presence of the etch-stop layer, the etching process used to etch the interlevel dielectric cannot damage the subjacent contact layer. The etch-stop layer must ultimately be removed, however. A problem faced in today's semiconductor manufacturing industry is that the etch-stop layer is conventionally removed by a plasma ion etching process that may damage the subjacent contact layer due to ion bombardment, the presence of fluorine-containing species or other aggressive etch conditions used to remove the etch-stop layer.

When the underlying contact surface is damaged, the sheet resistance of the contact layers increases and the contact resistance between the underlying conductive material and the conductive material introduced into the opening also increases, degrading the integrity of the electrical contact. Increased contact resistance may cause electrical contact failure and can lead to poor device performance or even complete device failure. It would therefore be desirable to address the shortcomings of conventional interconnect structures and the methods for forming them, by providing a method and structure for forming interconnect structures with undamaged contact surfaces.

SUMMARY OF THE INVENTION

To address the aforementioned needs and in view of its purposes, the present invention provides a method for forming a semiconductor interconnect structure. In one embodiment, the method includes forming an organic etch buffer layer over a substrate, forming a first layer over the organic etch barrier layer, forming a pattern in a photosensitive film disposed over the first layer and etching to remove the first layer and form an interconnect opening. The organic etch buffer layer is then removed thereby exposing the substrate. In another exemplary embodiment, the method includes the use of a photosensitive etch buffer layer. The organic or photosensitive etch buffer layers may be removed by wet etching, ashing, or DUV exposure followed by developing.

In another exemplary embodiment, the invention provides a method for forming an etch buffer layer over a conductive contact layer, forming an interlevel dielectric over the organic etch barrier layer, forming a pattern in a photosensitive film disposed over the interlevel dielectric and etching to remove the interlevel dielectric and form an interconnect opening. The etch buffer layer is then removed thereby exposing the conductive contact layer. The etch buffer layer may be an organic material, a photosensitive material, or both.

In another exemplary embodiment, an interconnect structure is provided the interconnect structure includes a contact layer formed over a substrate, an etch buffer layer formed over the contact layer, and a first layer formed over the etch buffer layer. The etch buffer layer is at least one of an organic material and a photosensitive material and is removable by methods that do not damage the contact layer. In an exemplary embodiment, the contact layer may advantageously be a conductive material and the first layer an interlevel dielectric.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures, each of which is a cross-sectional view.

DETAILED DESCRIPTION OF EMBODIMENTS OF THE INVENTION

The invention provides an organic and/or photosensitive etch buffer layer disposed between a contact layer and a first layer through which the contact layer is contacted. In one exemplary embodiment, the contact layer may be a conductive contact layer and the first layer an interlevel dielectric. In one embodiment in which a vertical contact opening is formed, the buffer layer may be disposed above a conductive contact layer in a semiconductor interconnect structure that may be used in damascene or dual damascene interconnect structures used in various applications and in various semiconductor devices. The invention may, for example be used in buried or butted contacts, or more conventional contacts. The invention further provides a method for forming an opening to contact the contact layer, using the etch buffer layer above the contact layer such that the contact layer is not damaged during the etch process used to form the opening or the etch process used to remove the etch buffer layer. The etch buffer layer may be removed by developing, wet etching or ashing, removal methods that do not use reactive ion etching, ion bombardment or fluorine-containing chemistries that may damage the exposed contact area of a conductive contact layer. In other exemplary embodiments, the organic and/or photosensitive etch buffer layer may be used between other layers of materials.

Now turning to the figures, each of exemplary process sequences illustrated in FIGS. 1A-1E, 2A-2C, 3A-3G, 4A-4E, and 5A-5E illustrate an exemplary process sequence that utilizes an organic and/or photosensitive etch buffer layer disposed above the contact layer to which contact is being made.

Figure 1A:
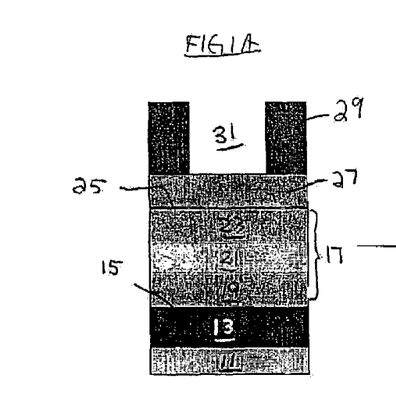
FIGS. 1A-1E illustrate a first exemplary embodiment of a process sequence for forming an interconnect structure according to the present invention.

FIG. 1A shows a film stack including contact layer 11 which may be a conductive layer such as a silicide, salicide or various other conductive materials such as metals, including metal alloys. Contact layer 11 may be formed over various substrates that are conventionally used in the semiconductor manufacturing industry. Etch buffer layer 13 is disposed above contact layer 11. Etch buffer layer 13 includes upper surface 15. First layer 17 is disposed over etch buffer layer 13 and first layer 17 may be a single film or it may represent a plurality of films such as films 19, 21 and 23 as in the illustrated exemplary embodiment. In an exemplary embodiment, first layer 17 may be an ILD (interlevel dielectric) and will be hereinafter referred to as ILD 17 in reference to the illustrated embodiment. Various suitable interlevel dielectric materials in various combinations, may be used. Above top surface 25 of ILD 17 is antireflective coating, ARC 27. ARC 27 may consist of a single layer or multiple layers. Etch buffer layer 13 is thus disposed between a conductive contact layer 11 and a dielectric layer, ILD 17, through which contact layer 11 is contacted in one exemplary embodiment. Photosensitive film 29 is formed over ARC 27 and is a patterned film including opening 31. Conventional methods may be used to form contact layer 11, the component film or films of ILD 17, ARC 27 and patterned photosensitive film 29.

Etch buffer layer 13 may be formed using spin-coating, CVD (chemical vapor deposition) or other techniques and may be a composite layer formed using two or more methods such as spin-coating and CVD. Although only a discrete section of etch buffer layer 13 is shown in the figures, it should be understood that etch buffer layer 13 may be a conformal film such as when formed by CVD or it may be a planarized film such as when formed by spin-coating. Etch buffer layer 13 may be an organic material which may be a photosensitive material. In another exemplary embodiment, etch buffer layer 13 may be a photosensitive material. In an exemplary embodiment, spin-on organic materials by Dow Chemical Company, for example, may be used for etch buffer layer 13, and in other exemplary embodiments, etch buffer layer 13 may be formed using chemical vapor deposition. For example, a CVD bottom antireflective coating (BARC) provided by Applied Materials, Inc., may be used. Etch buffer layer 13 is characterized as being readily removable by wet etching or ashing, or by developing after being photoactivated. RF etching processes, other ion etching processes or fluoride-containing chemistries are not required to remove etch buffer layer 13.

Figure 1B:
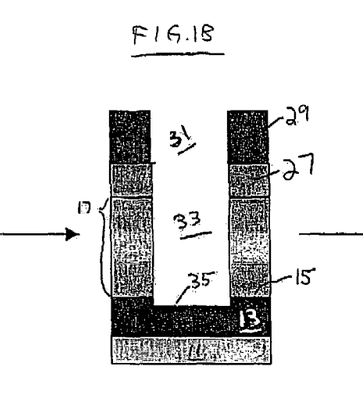

Turning to FIG. 1B, an etching process is carried out to form opening 33 defined by opening 31 of patterned photosensitive film 29. Conventional etching methods may be used to etch through ARC 27 and ILD 17. The etching operation terminates at etch buffer layer 13 to expose exposed portion 35 of etch buffer layer 13. Various RF or reactive ion etching processes may be used to remove ARC 27 and etch ILD 17 and may cause exposed portion 35 to be slightly receded below original upper surface 15, but it can be seen that contact layer 11 is not exposed during the ILD etching process. Such conventional dielectric etching processes may include ion bombardment and often use fluorine-containing chemistries. In other exemplary embodiments, the surface of exposed portion 35 may not be receded below original upper surface 15 of etch buffer layer 13.

Figure 1C:
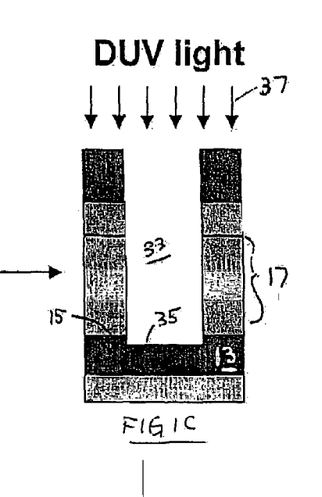
Figure 1D:
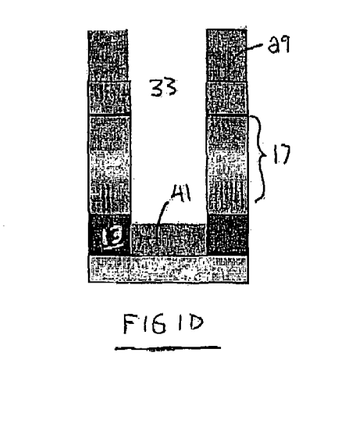

The structure shown in FIG. 1B is then subjected to exposure by deep ultraviolet (DUV) light as indicated by arrows 37 as shown in FIG. 1C. The exposure to DUV light photoactivates exposed portion 35 of etch buffer layer 13 as well as photosensitive film 29. Etch buffer layer 13 is chosen to be an organic or other photosensitive material. The DUV light exposure energy is chosen to completely photoactivate exposed portion 35. The DUV light exposure energy and the thickness of ILD 17 and ARC 27 are also chosen such that they combine to act as a mask and portions of etch buffer layer 13 masked by ILD 17 are not exposed or photoactivated. FIG. 1D shows exposed portion 35 of original etch buffer layer 13 converted to photoactivated portion 41.

Figure 1E:
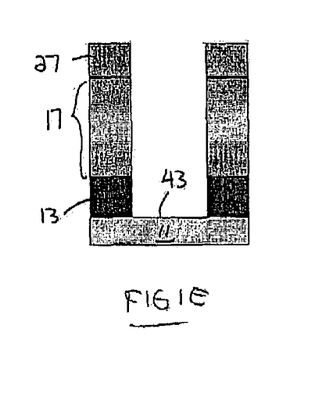

The structure is developed to remove photoactivated portion 41 and photosensitive film 29 to produce the structure shown in FIG. 1E in which contact surface 43 of contact layer 11 is exposed. The developer used to remove photoactivated portion 41 does not react with or attack contact layer 11 particularly when contact layer 11 is a conductive material. In an exemplary embodiment, TMAH (tetramethyl ammonium hydroxide) may be used as the developer. Since contact surface 43 is not subjected to any reactive ion etching processes that may include ion bombardment or the use of a fluorine-containing chemistry, contact surface 43 is undamaged. The integrity of contact surface 43 is thereby maintained. According to the embodiment in which contact layer is a conductive material, the sheet resistivity, Rs of contact surface 43 is not compromised and the contact resistance, Rc, of a contact subsequently made to contact surface 43 will be minimized.

Like reference numbers denote like features throughout the specification and drawing. As such, aspects of process sequences illustrated by FIGS. 2A-2C, 3A-3G, 4A-4E, and 5A-5E will be discussed in terms of differences between the subject process sequence and the aforementioned process sequence illustrated in FIGS. 1A-1E.

Figure 2A:
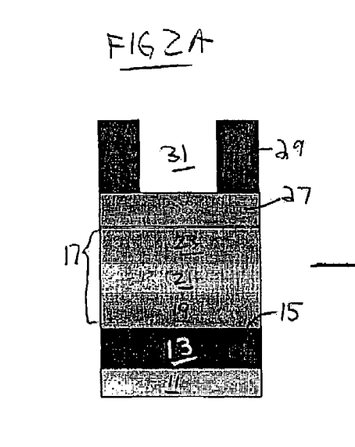
FIGS. 2A-2C illustrate a second exemplary embodiment of a process sequence for forming an interconnect structure according to the present invention.
Figure 2B:
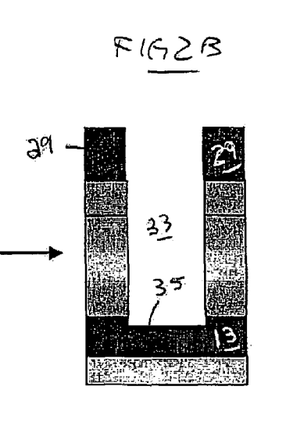
Figure 2C:
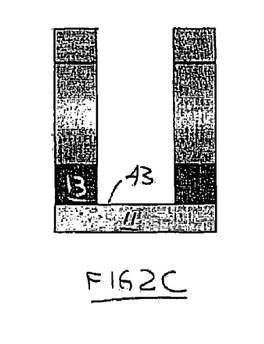

The exemplary process sequence shown in FIGS. 2A-2C illustrates another aspect of the invention. Etch buffer layer 13 illustrated in FIG. 2B may be a photosensitive material and/or an organic material. The structure of FIG. 2A is etched to form the structure shown in FIG. 2B and as described in conjunction with FIGS. 1A-1B. Exposed portion 35 may then be removed by wet etching or ashing. The ashing procedure is a oxygen-based operation typically carried out in a downstream reactor in which an oxygen plasma is used without a bias applied to the substrate or without RF power at the etching site or bias applied to the substrate. In addition to a $O_2$ plasma, mixtures of $N_2$, $H_2$, CO, $CO_2$, NO, $NO_2$, and $NH_3$ may be optionally included in the ashing process. The ashing procedure removes photosensitive film 29 as well as exposed portion 35 to produce contact surface 43. Contact surface 43 is therefore not subjected to ion bombardment, RF etching, or fluorine-containing chemistries.

According to the wet etching embodiment, liquid ozone may be used, and in other embodiments an SPM or APM solution may be used. In one embodiment, the liquid ozone may be present in a solution at a concentration of 5-500 ppm but other concentrations may be used in other exemplary embodiments. SPM is a mixture including sulfuric acid and hydrogen peroxide and APM is a mixture including ammonium hydroxide and hydrogen peroxide. Other wet etching materials may be used and may depend on the composition of etch stop layer 13, and after the wet etching procedure is concluded, conventional methods may be used to remove remnants of photosensitive film 29 to produce the structure shown in FIG. 2C. In another exemplary embodiment, supercritical $CO_2$ may be used. Supercritical $CO_2$ may be used at a pressure ranging from 1000 to 10000 psi and at a temperature of 30-70° C. in one exemplary embodiment. In yet another exemplary embodiment, an ashing procedure may be used in conjunction with wet etching.

Figure 3A:
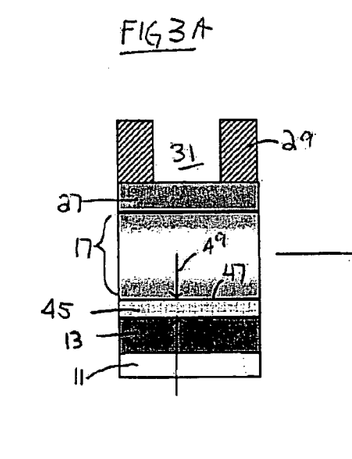
FIGS. 3A-3G illustrate a third exemplary embodiment of a process sequence for forming an interconnect structure according to the present invention.
Figure 3B:
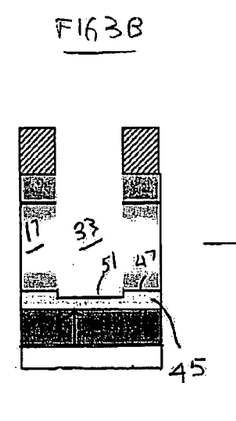
Figure 3C:
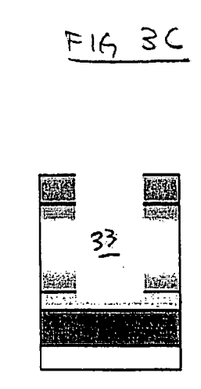
Figure 3D:
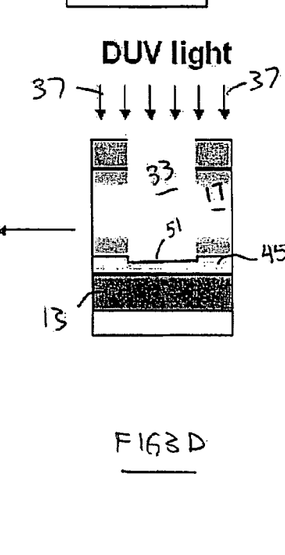
Figure 3E:
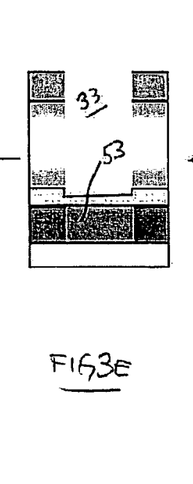
Figure 3F:
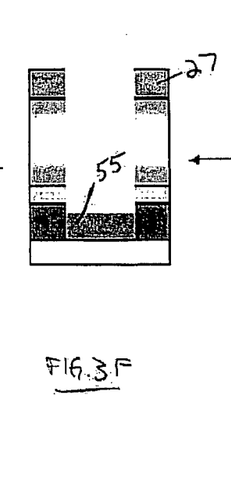
Figure 3G:
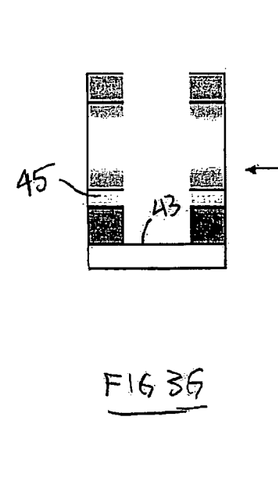
Figure 4A:
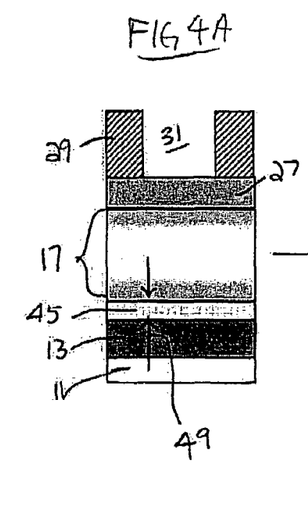
FIGS. 4A-4E illustrate a fourth exemplary embodiment of a process sequence for forming an interconnect structure according to the present invention.
Figure 4B:
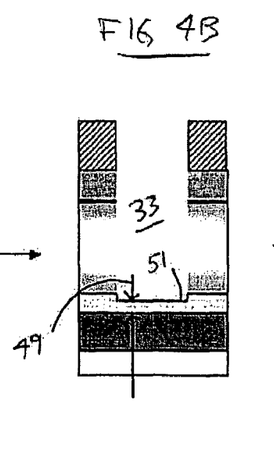
Figure 4C:
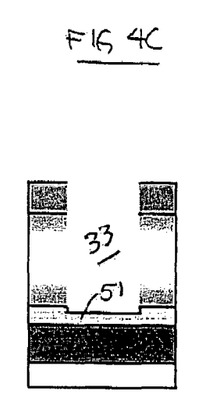
Figure 4D:
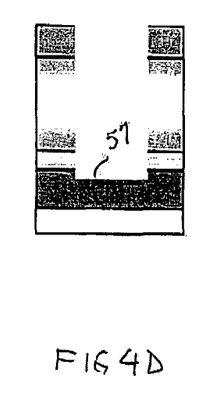
Figure 4E:
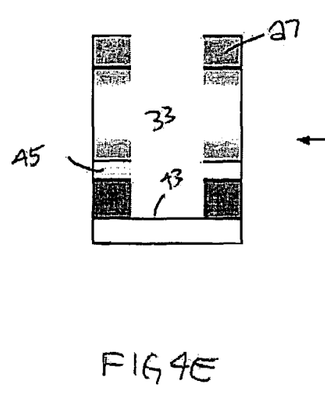

The exemplary process sequence shown in FIGS. 3A-3G includes an etch stop layer interposed between etch buffer layer 13 and first film 17 which may be an ILD and referred to as ILD 17. Etch stop layer 45 includes top surface 47 and may be formed of $Si_3N_4$, SiON, SiCN, SiOC, SiC or other suitable etch stop materials conventionally used in the art. In other embodiments, etch stop layer 45 may be formed of other compounds of Si, O, C, H and N. Etch stop layer 45 may be formed of various $SiN_x$, $SiO_xN_y$, $SiO_xC_y$, $SiC_x$, $SiO_x$, $SiF_x$, $SiO_xF_y$, and $SiC_xF_y$ compounds. In an exemplary embodiments, etch stop layer 47 may include a thicknesses 49 greater than 100 angstroms and less than 600 angstroms, but other thicknesses may be used in other exemplary embodiments. During the etching process used to break through ARC 27 and etch ILD 17, the surface of exposed portion 51 of etch stop layer 45 may become receded below original upper surface 47. Photosensitive film 29 is then stripped using conventional methods to produce the structure shown in FIG. 3C which is then subjected to DUV light exposure as indicated by arrows 37 shown in FIG. 3D. Original thickness 49 and the ILD etching process is chosen such that the DUV light can penetrate the remaining, exposed portion 51 of etch stop layer 45 and photoactivate the portion of etch buffer layer 13 disposed below opening 33 without photoactivating portions of etch buffer layer 13 disposed beneath, and masked by, ILD 17. This DUV light exposure operation produces photoactivated portion 53 shown in FIG. 3E. Turning to FIG. 3F, conventional methods are used to break through and remove exposed portion 51 of etch stop layer 45 and to expose remaining portion 55 of photoactivated portion 53. Conventional developing solutions such as TMAH may then be used to remove remaining portion 55 and expose contact surface 43 of contact layer 11 which may be a conductive material, as shown in FIG. 3G.

The sequence of processing operations shown in FIGS. 4A-4E illustrates another aspect of the invention. Etch buffer layer 13 may be a photosensitive material and/or an organic material. The exemplary process sequence of FIGS. 4A-4E includes etch stop layer 45 as discussed in FIGS. 3A-3G, and in the illustrated embodiment of FIG. 4C, exposed portion 51 remains until a breakthrough etch operation is used to remove exposed portion 51 and expose portion 57 of etch buffer layer 13. Portion 57 of etch buffer layer 13 is then removed from the structure shown in FIG. 4D to produce the structure shown in 4E, using a wet etching and/or ashing operation. In another exemplary embodiment, a variation of the sequence illustrated in FIGS. 3A-3G, a sequence of etch operations may be used to remove ILD 17 and etch stop layer 45, and expose portion 57, before wet etching and/or ashing operations are used to remove exposed portion 57 and photosensitive film 29. According to these exemplary embodiments, DUV exposure and photoactivation is not required and therefore etch buffer layer 13 need not be a photosensitive material though a photosensitive material may be used. As such, according to the exemplary process sequence shown in FIGS. 4A-4E, etch buffer layer 13 may be an organic and/or a photosensitive material.

Figure 5A:
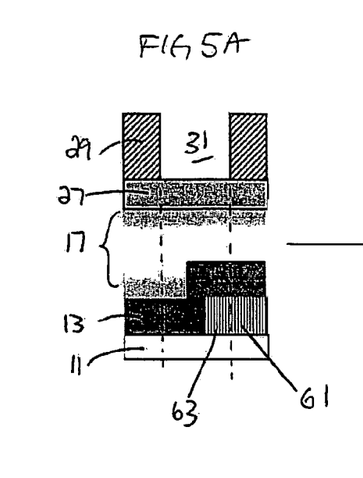
FIGS. 5A-5E illustrate a fifth exemplary embodiment of a process sequence for forming an interconnect structure according to the present invention.
Figure 5B:
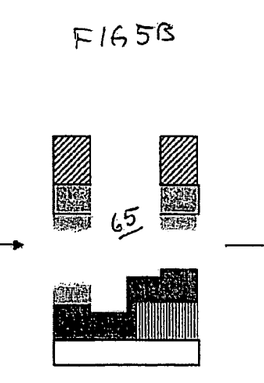
Figure 5C:
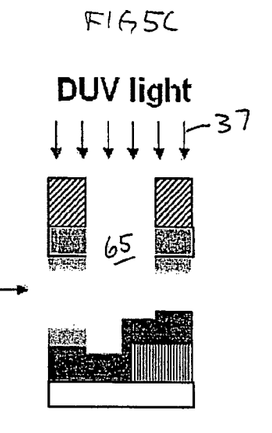
Figure 5D:
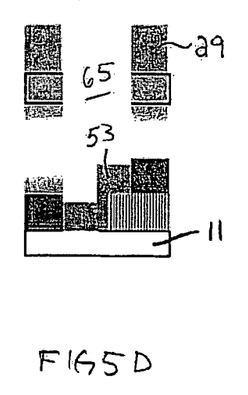
Figure 5E:
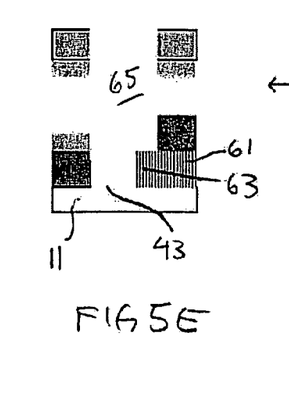

The process sequence shown in FIGS. 5A-5E illustrates an exemplary application of the invention applied to a butted contact such as known in the art. In this exemplary embodiment, encroaching portion 63 of spacer 61 extends into the area defined by and below opening 31. In an exemplary embodiment, spacer 61 may be formed of silicon nitride. In other exemplary embodiments, spacer 61 may be formed of SiON, SiOC, SiC, or other oxides. Spacer 61 may include a thickness of 100-800 angstroms in an exemplary embodiment. The configuration shown in FIG. 5A is intended to be exemplary only and other configurations of butted and buried contacts may utilize interconnect openings formed according to the invention. FIG. 5A shows etch buffer layer 13 formed over the step created by encroaching portion 63 within the area defined by (i.e., disposed below) opening 31. FIG. 5B shows the structure after a selective etching process has been carried out to remove ARC 29 and ILD 17 but not etch buffer layer 13, and to produce butted contact opening 65. Opening 65 has the illustrated step formed by encroaching portion 63 and includes a two-tiered configuration. After DUV light exposure photoactivates photoactivated section 53, the structure is developed to remove photoactivated section 53 and to form the structure shown in FIG. 5E including exposed encroaching portion 63 and contact surface 43. Encroaching portion 63 of spacer 61 remains exposed within butted contact opening 65.

The principles and examples described in conjunction with the process sequences shown previously in FIGS. 1A-1E, 2A-2C, 3A-3E and 4A-4E, also apply to the butted contact arrangement shown in FIGS. 5A-5E. For example, within the butted contact configuration, wet etching, ashing or supercritical $CO_2$ may be used to remove the portions of etch buffer layer which remain below the opening after the superjacent first layer, illustratively an ILD, is removed. Similarly an etch stop layer may be formed over the etch buffer layer in the butted contact example and after the etch stop layer is removed, the etch buffer layer may be removed using either wet etching or ashing, or developing after the etch buffer layer has been photoactivated by DUV light exposure with a portion of the etch stop light in place over the etch buffer layer. As another exemplary embodiment, a film of silicon nitride, SiON, SiOC, SiC, or other oxide material, such as used to form spacer 61 in FIGS. 5A-5E, may be formed between the contact layer 11 and ILD 17 and extend completely, rather than partially, across the opening 31. This film may be removed using an etching sequence as discussed in conjunction with FIGS. 5A-5E to expose an underlying contact surface.

The preceding merely illustrates the principles of the invention which are not intended to be limited to the aforedescribed exemplary embodiments. In other embodiments, for example, the organic and/or photosensitive etch buffer layer may be disposed between various other layers to enhance the etching process. For example, contact layer 11, may be a substrate or other non-conductive material desired to be exposed as an intermediate or permanent processing stage. Contact layer 11 may be a dielectric material in one exemplary embodiment. Similarly, first layer 17, which is being etched, may be formed of various materials in other exemplary embodiments, including a conductive material.

It will be appreciated that those skilled in the art will be able to devise various arrangements which, although not explicitly described or shown herein, embody the principals of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor interconnect structure comprising:

forming an organic etch buffer layer over a substrate;

forming a first layer over said organic etch buffer layer;

forming a pattern in a photosensitive film disposed over said first layer;

etching to remove said first layer to form an interconnect pattern with void areas therebetween; and etching a portion of said organic etch buffer layer disposed beneath said void areas using supercritical $CO_2$ using said interconnect pattern as a mask, thereby exposing said substrate.

2. The method as in claim 1, wherein said first layer comprises a conductive layer and said substrate comprises a dielectric layer.

3. The method as in claim 1, wherein said first layer comprises a dielectric layer and said substrate comprises a conductive layer.

4. A method for forming a semiconductor interconnect structure comprising:

forming an etch buffer layer over a conductive contact layer, said etch buffer layer being a photosensitive layer;

forming an interlevel dielectric over said etch buffer layer;

forming an opening in a photosensitive film disposed over said interlevel dielectric;

etching to remove said interlevel dielectric to form an interconnect opening; and removing a portion of said etch buffer layer disposed beneath said opening thereby exposing said conductive contact layer.

5. The method as in claim 4, wherein said forming an interlevel dielectric comprises forming a plurality of individual dielectric films.

6. The method as in claim 4, wherein said removing said portion of said etch buffer layer comprises exposing said etch buffer layer to deep ultraviolet light and developing said exposed etch buffer layer.

7. The method as in claim 6, wherein said developing comprises developing with a TMAH developer.

8. The method as in claim 4, wherein said removing comprises removing said portion of said etch buffer layer using supercritical $CO_2$.

9. The method as in claim 4, wherein said removing a portion of said etch buffer layer comprises wet etching.

10. The method as in claim 9, wherein said wet etching comprises at least one of liquid ozone, a mixture of sulfuric acid and hydrogen peroxide, and a mixture of ammonium hydroxide and hydrogen peroxide.

11. The method as in claim 1, wherein said forming an organic etch buffer layer comprises forming said organic etch buffer layer using at least one of spin-coating and CVD.

12. The method as in claim 4, wherein said forming an etch buffer layer comprises spin-coating said photosensitive film.

13. The method as in claim 4, further comprising forming a patterned film over a portion of said conductive contact layer and wherein said forming an opening includes said opening disposed over a part of said patterned film and said etching includes forming said interconnect opening over part of said patterned film and a portion of said conductive contact layer.

14. The method as in claim 13, wherein said patterned film comprises one of $SIN_x$, $SiO_xN_y$, $SiO_xC_y$, $SiC_x$, $SiO_x$, $SiF_x$, $SiO_xF_y$ and $SiC_xF_y$.

15. The method as in claim 4, further comprising forming a film between said conductive contact layer and said etch buffer layer and wherein said removing includes removing said film, said film comprising one of $SiN_x$, $SiO_xN_y$, $SiO_xC_y$, $SiC_x$, $SiO_x$, $SiF_x$, $SiO_xF_y$ and $SiC_xF_y$.

16. The method as in claim 4, wherein said conductive contact layer comprises one of a metal film, a silicide, or a salicide.

17. The method as in claim 4, further comprising forming an anti-reflective coating over said interlevel dielectric and wherein said etching includes removing a portion of said anti-reflective coating.

18. The method as in claim 16, wherein said forming an anti-reflective coating comprises forming a plurality of individual anti-reflective films.

19. The method as in claim 4, further comprising forming an etch-stop layer between said etch buffer layer and said interlevel dielectric and wherein said etching comprises removing no more than a portion of said etch-stop layer disposed beneath said interconnect opening.

20. The method as in claim 19, wherein a remaining portion of said etch-stop layer disposed below said interconnect opening is sufficiently thin to allow deep ultraviolet light to penetrate therethrough, and said removing said etch buffer layer comprises directing deep ultraviolet exposure through said remaining portion of said etch-stop layer, removing said remaining portion of said etch-stop layer and developing to remove said etch buffer layer.

21. The method as in claim 19 wherein said etch-stop layer comprises one of $SIN_x$, $SiO_xN_y$, $SiO_xC_y$, $SiO_x$, $SiF_x$, $SiO_xF_y$, and $SiC_xF_y$, and said forming an etch-stop layer comprises forming said etch-stop layer to a thickness no greater than 600 angstroms.

22. The method as in claim 4, wherein said removing said portion of said etch buffer layer includes ashing which further removes said photosensitive pattern.

23. The method as in claim 4, further comprising forming an etch-stop layer between said etch buffer layer and said interlevel dielectric and wherein said etching to remove said interlevel dielectric further removes said etch-stop layer and exposes said etch buffer layer.

24. A method for forming a semiconductor interconnect structure comprising:

forming an organic etch buffer layer over a substrate;

forming a conductive first layer over said organic etch buffer layer;

forming a pattern in a photosensitive film disposed over said conductive first layer;

etching to remove said conductive first layer to form an interconnect pattern with void areas therebetween; and removing a portion of said organic etch buffer layer disposed beneath said void areas thereby exposing said substrate.

25. A method for forming a semiconductor interconnect structure comprising:

forming an organic etch buffer layer over a dielectric layer substrate;

forming a first conductive layer over said organic etch buffer layer;

forming a pater in a photosensitive film disposed over said first conductive layer;

etching to remove said first conductive layer to form an interconnect pattern with void areas therebetween; and removing a portion of said organic etch buffer layer disposed beneath said void areas using supercritical $CO_2$, thereby exposing said dielectric layer substrate.

* * * * *

UNITED STATES PATENT AND TRADEMARK OFFICE
CERTIFICATE OF CORRECTION

PATENT NO.        : 7,341,935 B2                                              Page 1 of 1
APPLICATION NO.   : 10/877103
DATED             : March 11, 2008
INVENTOR(S)       : Ju-Wang Hsu, Jyu-Horng Shieh and Yi-Chun Huang It is certified that error appears in the above-identified patent and that said Letters Patent is hereby corrected as shown below:

Column 5, line 33, delete "embodiments" and insert -- embodiment -- therefor.

Column 5, line 33, delete "thicknesses" and insert -- thickness -- therefor.

Column 8, line 47, delete "In" and insert -- in -- therefor.

Column 10, line 12, delete "pater" and insert -- pattern --.

Signed and Sealed this

Twenty-fourth Day of August, 2010

David J. Kappos
*Director of the United States Patent and Trademark Office*